(12) United States Patent
Lee (10) Patent No.: US 7,956,654 B2
(45) Date of Patent: Jun. 7, 2011

(54) PREDRIVER AND OUTPUT DRIVER CIRCUIT USING THE SAME

(75) Inventor: Sung Kwon Lee, Yongin-si (KR)

(73) Assignee: Hynix Semiconductor Inc., Icheon-si (KR)

(*) Notice: Subject to any disclaimer, the term of this patent is extended or adjusted under 35 U.S.C. 154(b) by 0 days.

(21) Appl. No.: 12/455,595

(22) Filed: Jun. 4, 2009

(65) Prior Publication Data
US 2010/0194448 A1 Aug. 5, 2010

(30) Foreign Application Priority Data
Feb. 3, 2009 (KR) .................. 10-2009-0008509

(51) Int. Cl.
*H03B 1/00* (2006.01)
(52) U.S. Cl. ........................................ 327/108; 327/112
(58) Field of Classification Search .................. 327/108, 327/112, 170; 326/82, 83, 119, 121, 122
See application file for complete search history.

(56) References Cited

U.S. PATENT DOCUMENTS

| | | | |
|---|---|---|---|
| 6,265,914 B1 | 7/2001 | Randhawa | |
| 6,384,644 B2 * | 5/2002 | Yamazaki | 327/112 |
| 6,493,856 B2 * | 12/2002 | Usami et al. | 716/102 |
| 7,233,197 B2 * | 6/2007 | Marshall et al. | 327/566 |
| 7,239,182 B2 | 7/2007 | Fukazawa et al. | |
| 2007/0236262 A1 | 10/2007 | McClure | |
| 2008/0122478 A1 * | 5/2008 | Mei | 326/27 |

FOREIGN PATENT DOCUMENTS

| | | |
|---|---|---|
| JP | 11-031388 | 2/1999 |
| JP | 2002-367376 | 12/2002 |
| KR | 10-2005-0073982 | 7/2005 |
| KR | 10-2007-0036554 A | 4/2007 |
| KR | 10-2008-0024411 | 3/2008 |

* cited by examiner

*Primary Examiner* — Long Nguyen
(74) *Attorney, Agent, or Firm* — John P. White; Cooper & Dunham LLP (57) ABSTRACT

An output driver circuit includes a predriver control signal generation unit receiving a pull-up code signal, a pull-down code signal, a predriver selection signal and a read control signal and generating a pull-up control signal and a pull-down control signal; a predriver driven in response to the pull-up control signal and the pull-down control signal and receiving an internal data to drive a pull-up driving signal and a pull-down driving signal; and a driver receiving the pull-up driving signal and the pull-down driving signal and driving an output data outputted to a DQ pad, wherein the pull-up control signal and the pull-down control signal are enabled when the predriver is selected in a read operation period and a preset combination of the code signals is inputted.

9 Claims, 6 Drawing Sheets

FIG. 8

PREDRIVER AND OUTPUT DRIVER CIRCUIT USING THE SAME

TECHNICAL FIELD

The present invention relates to a semiconductor memory device, and more particularly, to a predriver capable of enhancing an operation speed and an output driver circuit using the same.

BACKGROUND

In general, an output driver circuit of a semiconductor memory device is used when outputting internal data to the outside through an output terminal or a DQ pad. The output driver circuit receives the internal data and drives an output data outputted to the DQ pad with a set driving strength.

Figure 1:
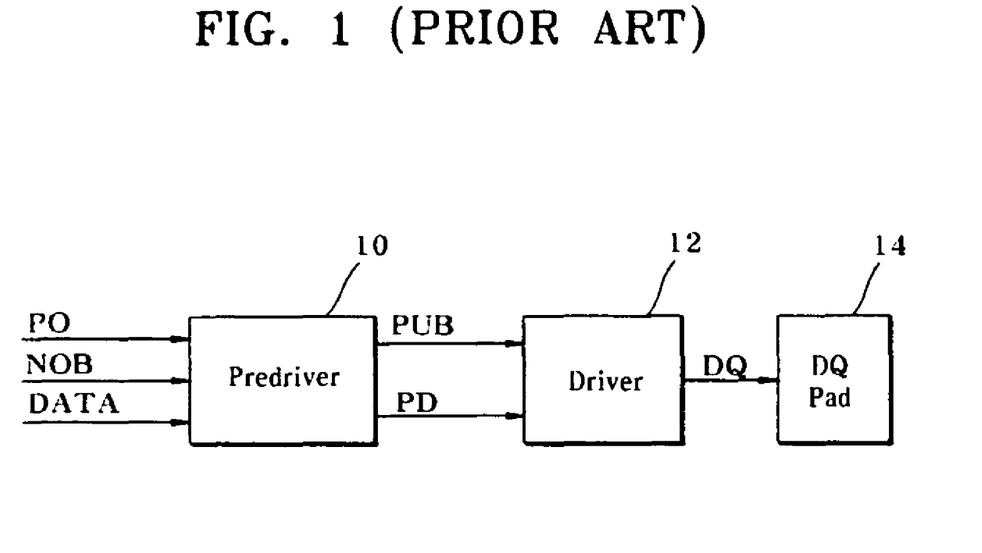
FIG. 1 is a block diagram illustrating a configuration of a conventional output driver circuit.

FIG. 1 is a block diagram illustrating a configuration of a conventional output driver circuit.

As shown, the conventional output driver circuit includes a predriver 10 which receives an internal data DATA and generates a pull-up driving signal PUB and a pull-down driving signal PD in response to a pull-up control signal PO and a pull-down control signal NOB, and a driver 12 which receives the pull-up driving signal PUB and the pull-down driving signal PD and drives an output data DQ outputted to a DQ pad 14. The driver 12 includes a pull-up device which pulls up the output data DQ in response to the pull-up driving signal PUB and a pull-down device which pulls down the output data DQ in response to the pull-down driving signal PD.

In order to enhance an operation speed of the output driver circuit configured as described above, it is required to increase sizes of the pull-up device and the pull-down device included in the driver 12 to increase the driving strength. When the sizes of the pull-up device and the pull-down device included in the driver 12 are increased, levels of the pull-up driving signal PUB and the pull-down driving signal PD also should be increased and this also requires increase in a size of the predriver 10. The increase in the size of the predriver 10 leads to increase in current consumption upon read or write operation and reduction in the operation speed of the output driver circuit.

SUMMARY

Embodiments of the present invention are directed to an output driver circuit which realizes a predriver using a MOS transistor with low threshold voltage and thus is able to reduce current consumption.

Also, embodiments of the present invention are directed to an output driver circuit which allows a predriver to be driven only in a read operation period and thus is able to prevent leakage current from being generated in a standby state.

In one embodiment, a predriver includes a driving unit including a MOS transistor with a low threshold voltage and receiving an internal data to drive a driving signal; and a switching unit stopping the driving of the driving unit in a non-read operation period.

The driving unit includes a pull-up device pulling up a first node, through which the driving signal is outputted, in response to the internal data; and a pull-down device pulling down the first node in response to the internal data.

The switching unit includes a first switching device turned on in the non-read-operation period to turn off the pull-up device; and a second switching device turned on in the non-read-operation period to turn off the pull-down device.

In another embodiment, an output driver circuit includes a predriver control signal generation unit receiving a pull-up code signal, a pull-down code signal, a predriver selection signal and a read control signal and generating a pull-up control signal and a pull-down control signal; a predriver driven in response to the pull-up control signal and the pull-down control signal and receiving an internal data to drive a pull-up driving signal and a pull-down driving signal; and a driver receiving the pull-up driving signal and the pull-down driving signal and driving an output data outputted to a DQ pad, wherein the pull-up control signal and the pull-down control signal are enabled when the predriver is selected in a read operation period and a preset combination of the code signals is inputted.

The predriver control signal generation unit includes a first logic device generating the pull-up control signal enabled when the predriver is selected in the read operation period and a preset combination of the pull-up code signal and the pull-down code signal is inputted; and a second logic device generating the pull-down control signal enabled when the predriver is selected in the read operation period and the preset combination of the pull-up code signal and the pull-down code signal is inputted.

Preferably, the first logic device performs NOR operation on the pull-up code signal, the predriver selection signal and the read control signal inputted thereto.

Preferably, the second logic device performs OR operation on the pull-down code signal, the predriver selection signal and the read control signal inputted thereto.

The predriver includes a pull-up predriver receiving the internal data in response to the pull-up control signal to drive the pull-up driving signal; and a pull-down predriver receiving the internal data in response to the pull-down control signal to drive the pull-down driving signal.

The pull-up predriver includes a first MOS transistor connected between a power voltage and a first node and turned on in response to the internal data; a second MOS transistor connected between the first node and a second node and turned on in response to the internal data; a third MOS transistor connected between the power voltage and the first node and turned on in response to the pull-up control signal; and a fourth MOS transistor connected between the second node and a ground voltage and turned on in response to the pull-up control signal.

Preferably, the first and second MOS transistors have threshold voltages lower than those of the third and fourth MOS transistors.

The pull-down predriver includes a first MOS transistor connected between a power voltage and a first node and turned on in response to the pull-down control signal; a second MOS transistor connected between the first node and a second node and turned on in response to the internal data; a third MOS transistor connected between the second node and a ground end and turned on in response to the internal data; and a fourth MOS transistor connected between the second node and a ground voltage and turned on in response to the pull-down control signal.

Preferably, the second and third MOS transistors have threshold voltages lower than those of the first and fourth MOS transistors.

The driver includes a pull-up device pulling up the output data outputted to the DQ pad in response to the pull-up driving signal; and a pull-down device pulling down the output data outputted to the DQ pad in response to the pull-down driving signal.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF SPECIFIC EMBODIMENTS

Hereinafter, exemplary embodiments of the present invention will be described with reference to accompanying drawings. However, the embodiments are for illustrative purposes only and are not intend to limit the scope of the invention.

Figure 2:
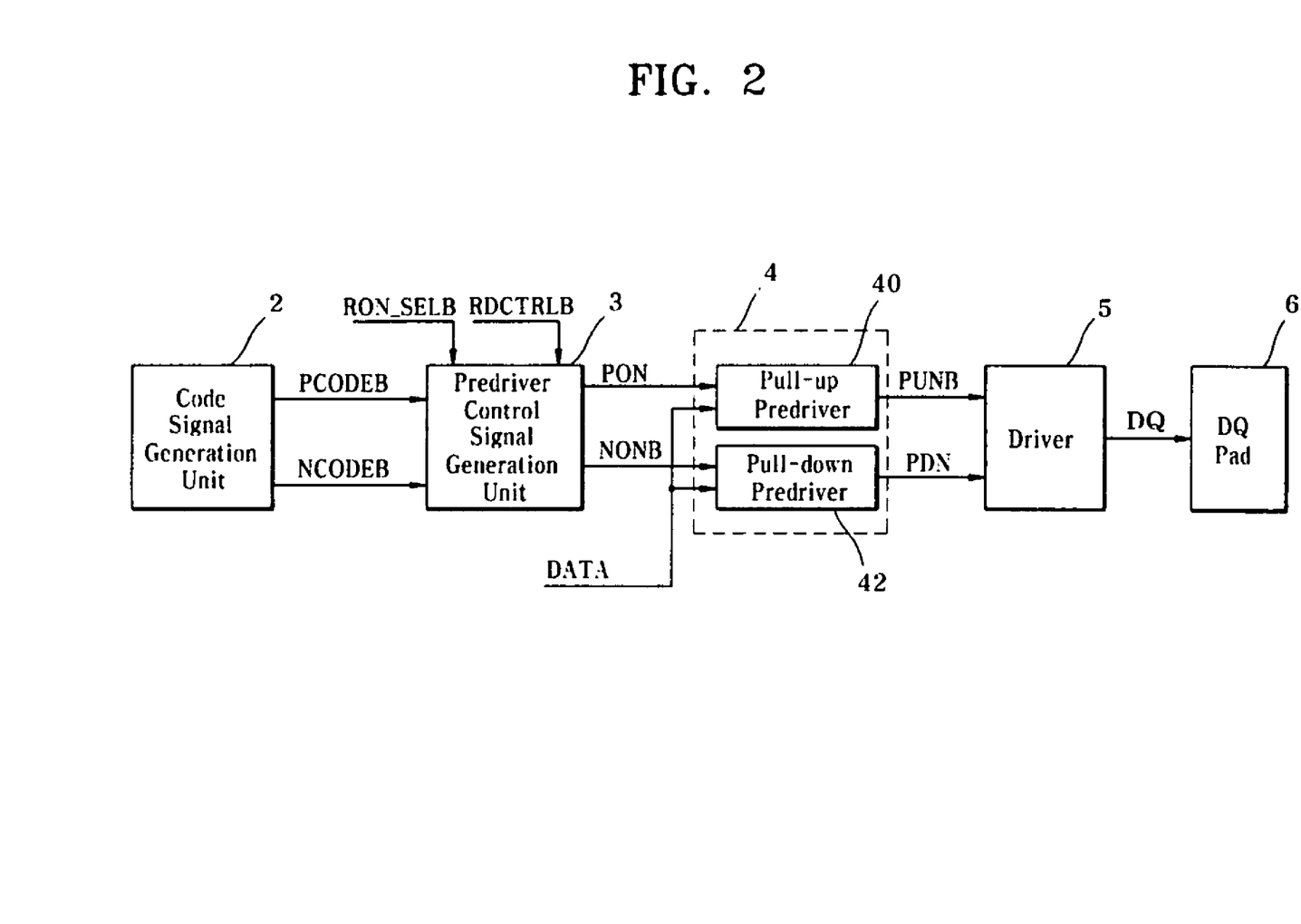
FIG. 2 is a block diagram illustrating a configuration of an output driver circuit in accordance with an embodiment of the present invention.

FIG. 2 is a block diagram illustrating a configuration of an output driver circuit in accordance with an embodiment of the present invention.

As shown, the output driver circuit in accordance with the present embodiment includes a code signal generation unit 2, a predriver control signal generation unit 3, a predriver 4, a driver 5 and a DQ pad 6. The predriver 4 includes a pull-up predriver 40 and a pull-down predriver 42.

Figure 3:
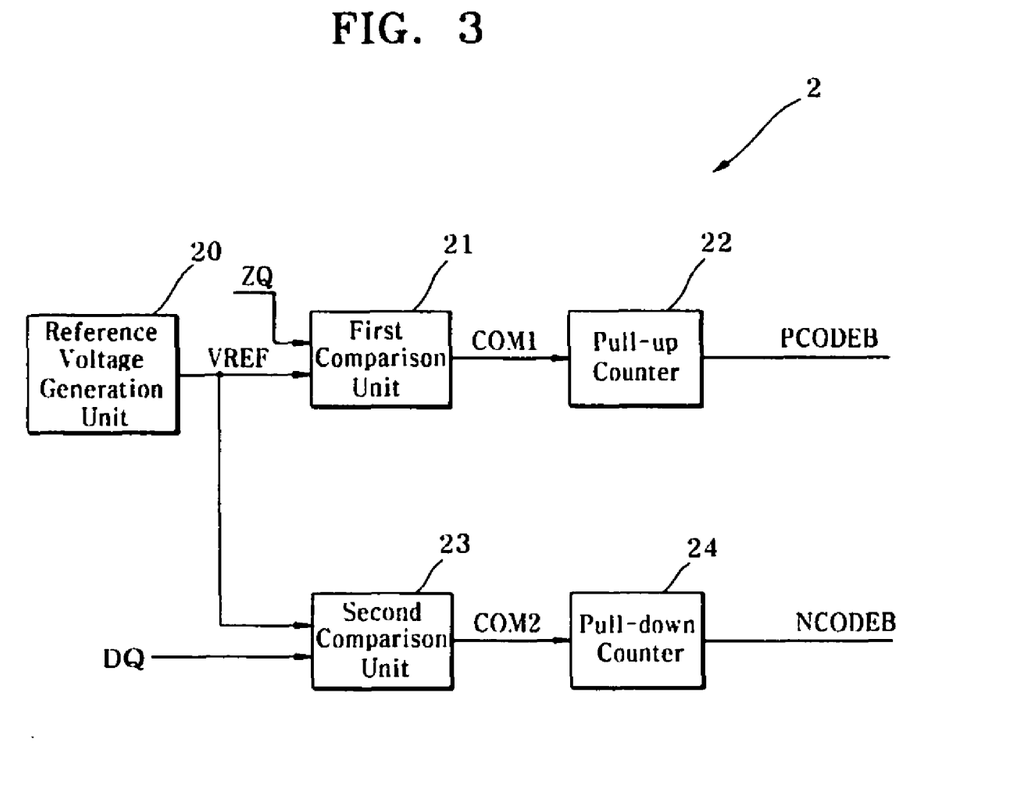
FIG. 3 is a block diagram illustrating a configuration of a code signal generation unit included in the output driver circuit shown in FIG. 2.

The code signal generation unit 2 includes, as shown in FIG. 3, a first comparison unit 21 which compares a signal ZQ of a ZQ pad (not shown) and a reference voltage VREF to generate a first comparison signal COM1, a pull-up counter 22 which counts a pull-up code signal PCODEB when the first comparison signal is enabled, a second comparison unit 23 which compares an output signal DQ and the reference voltage VREF to generate a second comparison signal COM2 and a pull-down counter 24 which counts a pull-down code signal NCODEB when the second comparison signal COM2 is enabled. Here, the code signal generation unit 2 generates the pull-up code signal PCODEB for adjusting a driving force of pulling up the signal ZQ of the ZQ pad and the pull-down code signal NCODEB for adjusting a driving force of pulling down the output signal DQ to perform an impedance calibration (ZQ calibration) for calibrating a resistance value of an ODT circuit. While the code signal generation unit 2 generating the pull-up code signal PCODEB and the pull-down code signal NCODEB of 1 bit is exemplarily described in the present embodiment, the code signal generation unit 2 can be configured, if necessary, to generate the pull-up code signal PCODEB and the pull-down code signal NCODEB of a plurality of bits.

Figure 4:
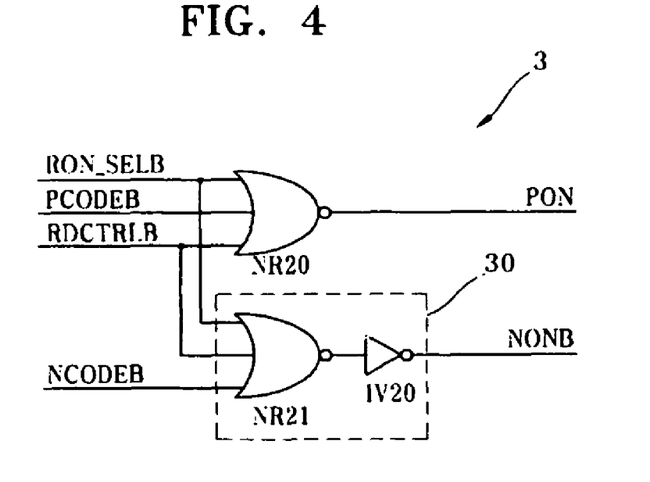
FIG. 4 is a block diagram illustrating a configuration of a predriver control signal generation unit included in the output driver circuit shown in FIG. 2.

The predriver control signal generation unit 3 includes, as shown in FIG. 4, a NOR gate NR20 which performs NOR operation on a predriver selection signal RON_SELB, a read control signal RDCTRLB and the pull-up code signal PCODEB inputted thereto to output a pull-up control signal PON and a logic unit 30 which performs OR operation on the predriver selection signal RON_SELB, the read control signal RDCTRLB and the pull-down code signal NCODEB inputted thereto to output a pull-down control signal NONB.

Here, the predriver selection signal RON_SELB is a signal set in a Mode Register Set (MRS) and is a signal enabled to a low level to drive the predriver 4. Also, the read control signal RDCTRLB is a signal enabled to a low level in the read operation period.

The predriver control signal generation unit 3 configured as described above generates, to drive the predriver 4 in the read operation period, the pull-up control signal PON enabled to a high level and the pull-down control signal enabled to a low level NONB when the pull-up code signal PCODEB is inputted to a low level with the predriver selection signal RON_SELB being inputted to a low level. Meanwhile, the predriver control signal generation unit 3 generates the pull-up control signal PON disabled to a low level and the pull-down control signal disabled to a high level NONB regardless of the levels of the predriver selection signal RON_SELB and the pull-up code signal PCODEB in a non-read-operation period.

Figure 5:
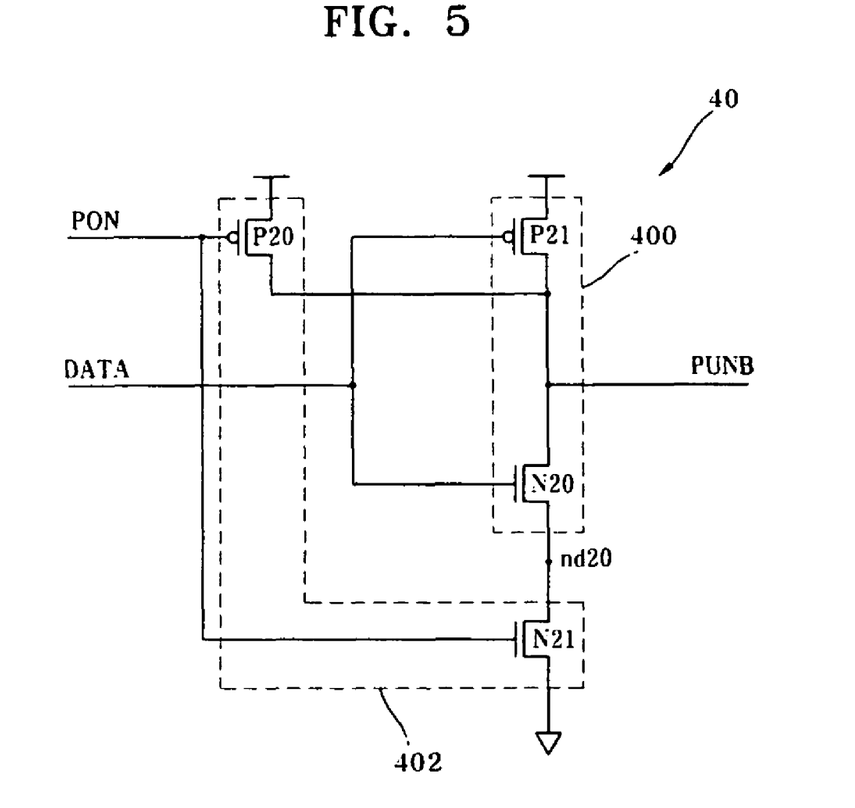
FIG. 5 is a block diagram illustrating a configuration of a pull-up predriver included in the output driver circuit shown in FIG. 2.

The pull-up predriver 40 includes a first driving unit 400 and a first switching unit 402 as shown in FIG. 5. The first driving unit 400 includes a PMOS transistor P21 which is connected between a power voltage end and an output node of a pull-up driving signal PUNB and is turned on by the internal data DATA inputted thereto to pull up the pull-up driving signal PUNB, and an NMOS transistor N20 which is connected between the output node of the pull-up driving signal PUNB and a node nd20 and is turned on by the internal data inputted thereto to pull down the pull-up driving signal PUNB. The first switching unit 402 includes a PMOS transistor P20 which is connected between the power voltage end and the output node of the pull-up driving signal PUNB and is turned on in response to the pull-up control signal PON, and an NMOS transistor N21 which is connected between the node nd20 and a ground end and is turned on in response to the pull-up control signal PON. Here, the PMOS transistor P21 and the NMOS transistor N20 included in the first driving unit 400 are realized with MOS transistors with a low threshold voltage. This is for increasing the driving force of the first driving unit 400 to enhance an operation speed of the pull-up predriver 40. As such, by realizing the PMOS transistor P21 and the NMOS transistor N20 of the first driving unit 40 with low threshold voltage (LVT) transistors to ensure the driving force, it is possible to reduce sizes of the PMOS transistor P21 and the NMOS transistor N20. At this time, the internal data DATA is a final data outputted from a pipeline latch (not shown).

The pull-up predriver 40 configured as described above generates, in the read operation period, the pull-up driving signal PUNB enabled to a low level when the internal data DATA is inputted to a high level with the pull-up control signal PON being inputted to a high level. Meanwhile, the pull-up predriver 40 generates the pull-up driving signal PUNB disabled to a high level regardless of the internal data DATA in the non-read-operation period, e.g. in a standby state.

Figure 6:
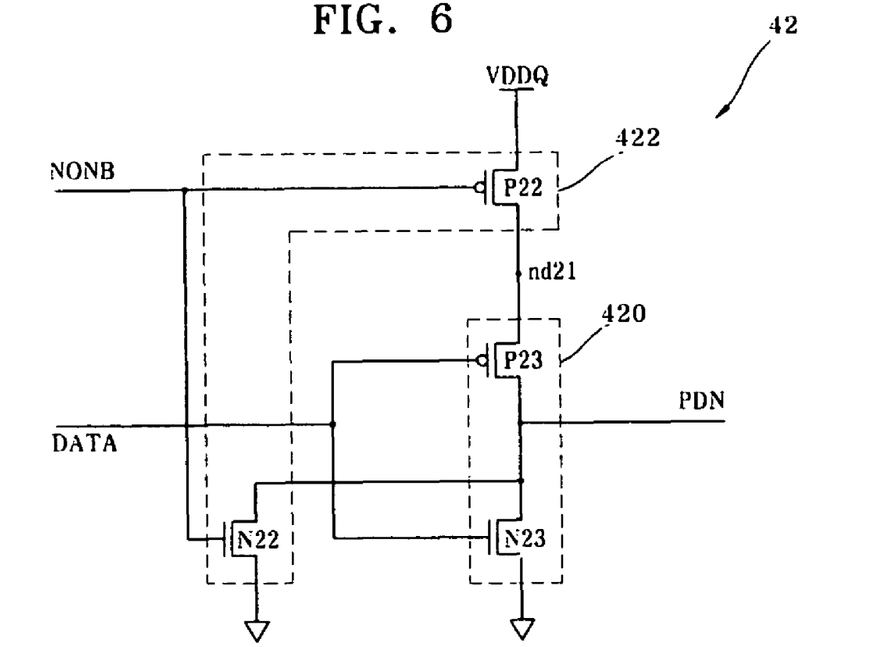
FIG. 6 is a block diagram illustrating a configuration of a pull-down predriver included in the output driver circuit shown in FIG. 2.

The pull-down driver 42 includes a second driving unit 420 and a second switching unit 422 as shown in FIG. 6. The second driving unit 420 includes a PMOS transistor P23 which is connected between a node nd21 and an output node of a pull-down driving signal PDN and is turned on by the internal data DATA inputted thereto to pull up the pull-down driving signal PDN, and an NMOS transistor N23 which is connected between the output node of the pull-down driving signal PDN and the ground end and receives the internal data DATA to pull down the pull-down driving signal PDN. The second switching unit 422 includes a PMOS transistor P22 which is connected between the power voltage end and the node nd21 and is turned on in response to the pull-down control signal NONB, and an NMOS transistor N22 which is connected between the output node of the pull-down driving signal PDN and the ground end and is turned on in response to the pull-down control signal NONB. Here, the PMOS transistor P23 and the NMOS transistor N23 included in the second driving unit 420 are realized with MOS transistors with a low threshold voltage. This is for increasing the driving force of the second driving unit 420 to enhance an operation speed of the pull-down predriver 42. As such, by realizing the PMOS transistor P23 and the NMOS transistor N23 of the second driving unit 42 with LVT transistors to ensure the driving force, it is possible to reduce sizes of the PMOS transistor P23 and the NMOS transistor N23.

The pull-down predriver 42 configured as described above generates, in the read operation period, the pull-down driving signal PDN enabled to a high level when the internal data DATA is inputted to a low level with the pull-down control signal NONB being inputted to a low level. Meanwhile, the pull-down predriver 42 generates the pull-down driving signal PDN disabled to a low level regardless of the internal data DATA in the non-read-operation period.

Figure 7:
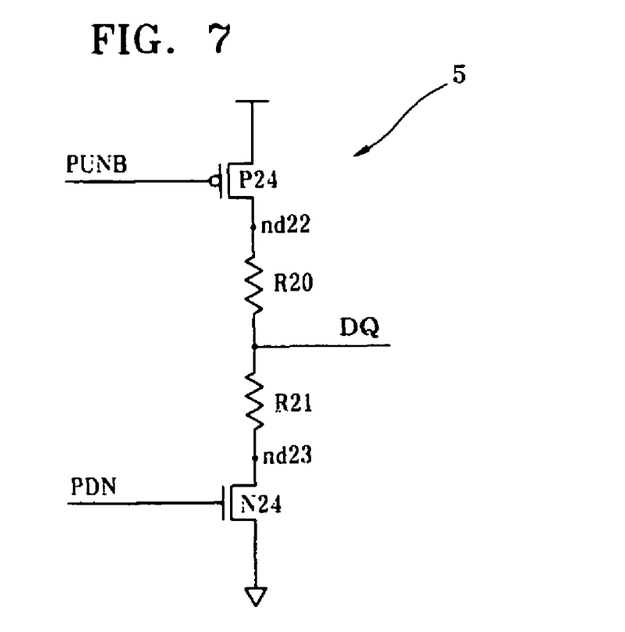
FIG. 7 is a block diagram illustrating a configuration of a driver included in the output driver circuit shown in FIG. 2.

The driver 5 includes, as shown in FIG. 7, a PMOS transistor P24 which is connected between the power voltage end and a node nd22 and is turned on in response to the pull-up driving signal PUNB, a resistance device R20 which is connected between the node nd22 and the output node of the output data DQ, a resistance device R21 which is connected between the output node of the output data DQ and a node nd23, and an NMOS transistor N24 which is connected between the node nd23 and the ground end and is turned on in response to the pull-down driving signal PDN.

The driver 5 configured as described above receives the pull-up driving signal PUNB enabled to a low level and drives the output data DQ at a high level outputted to the DQ pad 6 in the read operation period. Also, the driver 5 receives the pull-down driving signal PDN enabled to a high level and drives the output data DQ at a low level outputted to the DQ pad 6 in the read operation period. Meanwhile, the driver 5 is not driven in the non-read-operation period.

Operation of the output driver circuit configured as described above will be described with respect to the read operation period and the non-read-operation period, respectively.

Hereinafter, the operation of the output driver circuit in the read operation period will be described with respect to an exemplary case that the pull-up code signal PCODEB and the pull-down code signal NCODEB are generated to a low level and the predriver selection signal RON_SELB is generated to a low level by the MRS.

First, the predriver control signal generation unit 3 receives the predriver selection signal RON_SELB, the read control signal RDCTRLB, the pull-up code signal PCODEB and the pull-down code signal NCODEB and generates the pull-up control signal PON and the pull-down control signal NONB. At this time, since the read control signal RDCTRLB is at a low level in the read operation period, the predriver control signal generation unit 3 generates the pull-up control signal PON enabled to a high level and the pull-down control signal NONB enabled to a low level.

Next, the pull-up predriver 40 receives the internal data DATA in response to the pull-up control signal PON to drive the pull-up driving signal PUNB. More specifically, since the pull-up control signal PON is enabled to a high level to turn off the PMOS transistor P20 and turn on the NMOS transistor N21, the first driving unit 400 is enabled. The enabled first driving unit 400 drives the pull-up driving signal PUNB by the internal data DATA, in which the input of the internal data DATA at a high level turns on the NMOS transistor N20 to pull down the pull-up driving signal PUNB to a low level and the input of the internal data DATA at a low level turns on the PMOS transistor P21 to pull up the pull-up driving signal PUNB to a high level. Here, since the PMOS transistor P21 and the NMOS transistor N20 are realized with MOS transistors with a low threshold voltage and thus the first driving unit 400 can ensure a sufficient operation speed, it is not necessary to increase the sizes of the PMOS transistor P21 and the NMOS transistor N20 together with the increase in the size of the driver 5.

Next, the pull-down predriver 42 receives the internal data DATA in response to the pull-down control signal NONB to drive the pull-down driving signal PDN. More specifically, since the pull-down control signal NONB is enabled to a low level to turn on the PMOS transistor P22 and turn off the NMOS transistor N22, the second driving unit 420 is enabled. The enabled second driving unit 420 drives the pull-down driving signal PDN by the internal data DATA, in which the input of the internal data DATA at a high level turns on the NMOS transistor N23 to pull down the pull-down driving signal PDN to a low level and the input of the internal data DATA at a low level turns on the PMOS transistor P23 to pull up the pull-down driving signal PDN to a high level. Here, since the PMOS transistor P23 and the NMOS transistor N23 are realized with MOS transistors with a low threshold voltage and thus the second driving unit 420 can ensure a sufficient operation speed, it is not necessary to increase the sizes of the PMOS transistor P23 and the NMOS transistor N23 together with the increase in the size of the driver 5.

Next, the driver 5 receives the pull-up driving signal PUNB and the pull-down driving signal PDN and drives the output data DQ outputted to the DQ pad 6. More specifically, since the input of the internal data DATA at a high level PDN drives the pull-up driving signal PUNB to a low level and the pull-down driving signal PDN to a low level, the output data DQ is driven to a high level by the turned-on PMOS transistor P24. Meanwhile, since the input of the internal data DATA at a low level PDN drives the pull-up driving signal PUNB to a high level and the pull-down driving signal PDN to a high level, the output data DQ is driven to a low high level by the turned-on PMOS transistor P24.

Hereinafter, the operation of the output driver circuit in the non-read-operation period will be described with respect to an exemplary case that the pull-up code signal PCODEB and the pull-down code signal NCODEB are generated to a low level and the predriver selection signal RON_SELB is generated to a low level by the MRS.

First, the predriver control signal generation unit 3 receives the predriver selection signal RON_SELB, the read control signal RDCTRLB, the pull-up code signal PCODEB and the pull-down code signal NCODEB and generates the pull-up control signal PON and the pull-down control signal NONB. At this time, since the read control signal RDCTRLB is at a high level in the non-read-operation period, the predriver control signal generation unit 3 generates the pull-up control signal PON disabled to a low level and the pull-down control signal NONB disabled to a high level.

Next, the pull-up predriver 40 receives the internal data DATA in response to the pull-up control signal PON to drive the pull-up driving signal PUNB. More specifically, since the pull-up control signal PON is disabled to a low level to turn on the PMOS transistor P20 and turn off the NMOS transistor N21, the first driving unit 400 is disabled. The disabled first driving unit 400 drives the pull-up driving signal PUNB regardless of the internal data DATA. At this time, since the PMOS transistor P21 and the NMOS transistor N20 are definitely turned off by the turned-on PMOS transistor P20 and the turned-off NMOS transistor N21, the leakage current generated when the first driving unit 400 is not driven is cut off.

Next, the pull-down predriver 42 receives the internal data DATA in response to the pull-down control signal NONB to drive the pull-down driving signal PDN. More specifically, since the pull-down control signal NONB is disabled to a high level to turn off the PMOS transistor P22 and turn on the NMOS transistor N22, the second driving unit 420 is disabled. The disabled second driving unit 420 drives the pull-down driving signal PDN to a low level regardless of the internal data DATA. At this time, since the PMOS transistor P23 and the NMOS transistor N23 are definitely turned off by the turned-off PMOS transistor P22 and the turned-on NMOS transistor N22, the leakage current generated when the second driving unit 420 is not driven is cut off.

As such, in the non-read-operation period, since the pull-up predriver 40 generates the pull-up driving signal PUNB at a high level and the pull-down predriver 42 generates the pull-down driving signal PDN at a low level, the driver 5 stops the driving of the output data DQ outputted to the DQ pad.

As described above, since the PMOS transistor P21 and the NMOS transistor N20 of the pull-up predriver 40 and the PMOS transistor P23 and the NMOS transistor N23 of the pull-up predriver 42 are realized with MOS transistors with a low threshold voltage, the output driver circuit in accordance with the present embodiment can drive the internal data DATA by the inputted internal data DATA in a high speed in the read operation period. Also, the output driver circuit in accordance with the present embodiment prevents, in the non-read-operation period, the generation of the leakage current by disabling the pull-up control signal PON and the pull-down control signal NONB to prevent the driving of the first driving unit 400 of the pull-up predriver 40 and the second driving unit 420 of the pull-down predriver 42.

Figure 8:
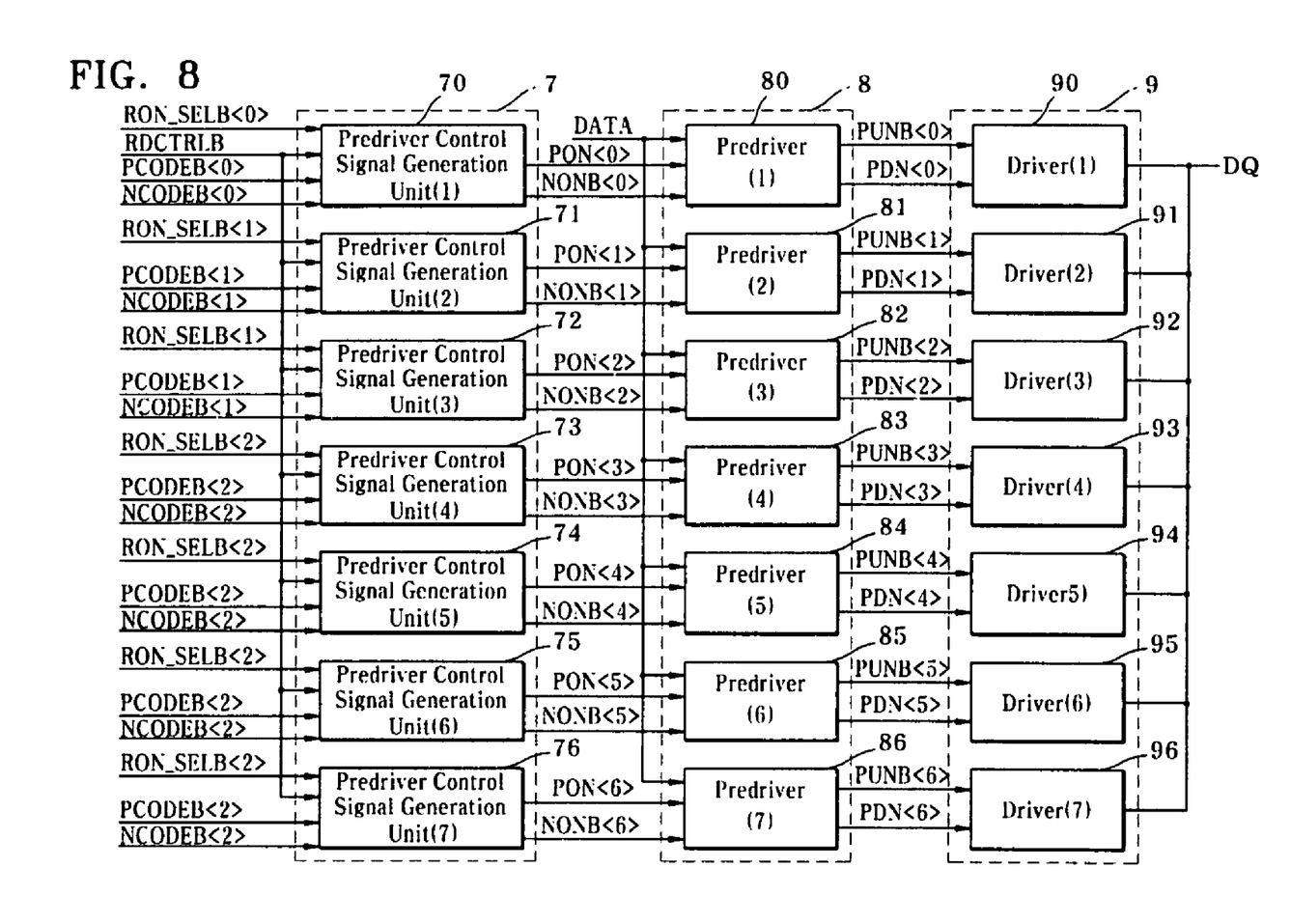
FIG. 8 is a block diagram illustrating a configuration of an output driver circuit in accordance with another embodiment of the present invention.

FIG. 8 is a block diagram illustrating a configuration of an output driver circuit in accordance with another embodiment of the present invention.

The output driver circuit in accordance with the embodiment shown in FIG. 8 includes a predriver control signal generation unit 7 provided with first to seventh predriver control signal generation units 70-76, a predriver 8 provided with first to seventh predrivers 80-86, and a driver 9 provided with first to seventh drivers 90-96.

The first predriver control signal generation unit 70 receives a first pull-up code signal PCODEB<0>, a first pull-down code signal NCODEB<0>, a read control signal RDCTRLB and a first predriver selection signal RON_SELB<0> and generates a first pull-up control signal PON<0> and a first pull-down control signal NONB<0>. The first predriver control signal generation unit 70 can be realized as same as the circuit shown in FIG. 4.

The second and third predriver control signal generation units 71, 72 receive a second pull-up code signal PCODEB<1>, a second pull-down code signal NCODEB<1>, the read control signal RDCTRLB and a second predriver selection signal RON_SELB<1> and generates second and third pull-up control signals PON<1:2> and second and third pull-down control signals NONB<1:2>. The second and third predriver control signal generation units 71, 72 can be realized as same as the circuit shown in FIG. 4.

The fourth to seventh predriver control signal generation units 73-76 receive a third pull-up code signal PCODEB<2>, a third pull-down code signal NCODEB<2>, the read control signal RDCTRLB and a third predriver selection signal RON_SELB<2> and generates fourth to seventh pull-up control signals PON<3:6> and fourth to seventh pull-down control signal NONB<3:6>. The fourth to seventh predriver control signal generation units 73-76 can be realized as same as the circuit shown in FIG. 4.

The first to seventh predriver 80-86 receive the internal data DATA in response to the first to seventh pull-up control signals PON<0:6> to first to seventh pull-up driving signals PUNB<0:6> and first to seventh pull-down driving signals PDN<0:6>, and can be realized as same as the circuits shown in FIGS. 5 and 6, respectively.

In the output driver circuit in accordance with the present embodiment as described above, when the first predriver selection signal RON>SELB<0> is enabled to a low level, the first predriver control signal generation unit 70 driven by receiving the first pull-up code signal <PCODEB<0> and the first pull-down code signal NCODEB<0>, the first predriver 80 and the first driver 90 are driven. Also, in the output driver circuit in accordance with the present embodiment, when the second predriver selection signal RON>SELB<1> is enabled to a low level, the second and third predriver control signal generation units 71, 72 driven by receiving the second pull-up code signal <PCODEB<1> and the second pull-down code signal NCODEB<1>, the second and third predrivers 81, 82 and the second and third drivers 91, 92 are driven. Further, in the output driver circuit in accordance with the present embodiment, when the third predriver selection signal RON>SELB<2> is enabled to a low level, the fourth to seventh predriver control signal generation units 73-76 driven by receiving the third pull-up code signal <PCODEB<2> and the third pull-down code signal NCODEB<2>, the fourth to seventh predrivers 83-86 and the fourth to seventh drivers 93-96 are driven.

While the present invention has been described with respect to the specific embodiments, it will be apparent to those skilled in the art that various changes and modifications may be made without departing from the spirit and scope of the invention as defined in the following claims.

The present disclosure claims priority to Korean application 10-2009-0008509, filed on Feb. 3, 2009, the entire contents of which are incorporated herein by reference.

What is claimed is:

1. An output driver circuit, comprising:
   a predriver control signal generation unit receiving a pull-up code signal, a pull-down code signal, a predriver selection signal and a read control signal and generating a pull-up control signal and a pull-down control signal;
   a predriver driven in response to the pull-up control signal and the pull-down control signal and receiving an internal data to drive a pull-up driving signal and a pull-down driving signal; and
   a driver receiving the pull-up driving signal and the pull-down driving signal and driving an output data outputted to a DQ pad,
   wherein the predriver control signal generation unit includes:
   a first logic device generating the pull-up control signal enabled when the predriver is selected in the read operation period and a preset combination of the pull-up code signal and the pull-down code signal is inputted; and a second logic device generating the pull-down control signal enabled when the predriver is selected in the read operation period and the preset combination of the pull-up code signal and the pull-down code signal is inputted.

2. The output driver circuit of claim 1, wherein the first logic device performs NOR operation on the pull-up code signal, the predriver selection signal and the read control signal inputted thereto.

3. The output driver circuit of claim 1, wherein the second logic device performs OR operation on the pull-down code signal, the predriver selection signal and the read control signal inputted thereto.

4. The output driver circuit of claim 1, wherein the predriver includes:
  a pull-up predriver receiving the internal data in response to the pull-up control signal to drive the pull-up driving signal; and
  a pull-down predriver receiving the internal data in response to the pull-down control signal to drive the pull-down driving signal.

5. The output driver circuit of claim 4, wherein the pull-up predriver includes:
  a first MOS transistor connected between a power voltage and a first node and turned on in response to the internal data;
  a second MOS transistor connected between the first node and a second node and turned on in response to the internal data;
  a third MOS transistor connected between the power voltage and the first node and turned on in response to the pull-up control signal; and
  a fourth MOS transistor connected between the second node and a ground voltage and turned on in response to the pull-up control signal.

6. The output driver circuit of claim 5, wherein the first and second MOS transistors have threshold voltages lower than those of the third and fourth MOS transistors.

7. The output driver circuit of claim 4, wherein the pull-down predriver includes:
  a first MOS transistor connected between a power voltage and a first node and turned on in response to the pull-down control signal;
  a second MOS transistor connected between the first node and a second node and turned on in response to the internal data;
  a third MOS transistor connected between the second node and a ground end and turned on in response to the internal data; and
  a fourth MOS transistor connected between the second node and a ground voltage and turned on in response to the pull-down control signal.

8. The output driver circuit of claim 7, wherein the second and third MOS transistors have threshold voltages lower than those of the first and fourth MOS transistors.

9. The output driver circuit of claim 1, wherein the driver includes:
  a pull-up device pulling up the output data outputted to the DQ pad in response to the pull-up driving signal; and
  a pull-down device pulling down the output data outputted to the DQ pad in response to the pull-down driving signal.

* * * * *